(12) United States Patent
Yang

(10) Patent No.: US 7,566,947 B2
(45) Date of Patent: Jul. 28, 2009

(54) SEMICONDUCTOR DEVICE WITH BIPOLAR TRANSISTOR AND METHOD OF FABRICATING THE SAME

(75) Inventor: Bong-Gil Yang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 20 days.

(21) Appl. No.: 11/647,221

(22) Filed: Dec. 29, 2006

(65) Prior Publication Data
US 2007/0166939 A1     Jul. 19, 2007

(30) Foreign Application Priority Data
Jan. 3, 2006    (KR)  .................. 10-2006-0000620

(51) Int. Cl.
*H01L 27/102* (2006.01)
(52) U.S. Cl. .................. 257/587; 257/557; 257/565; 257/E29.197; 257/E29.199
(58) Field of Classification Search ............ 257/526, 257/552, 557, 565, 587, E29.197, E29.198, 257/E29.199
See application file for complete search history.

(56) References Cited

U.S. PATENT DOCUMENTS 5,217,909 A * 6/1993 Bertagnolli ................ 438/320
6,744,080 B2 * 6/2004 Chantre et al. ............ 257/197
2004/0251515 A1   12/2004 Yang et al.

FOREIGN PATENT DOCUMENTS

| KR | 10-2003-0045941 | 6/2003 |
| KR | 10-2004-0041752 | 5/2004 |
| KR | 10-2004-0107779 | 12/2004 |

* cited by examiner

*Primary Examiner*—Matthew E Warren
(74) *Attorney, Agent, or Firm*—Harness, Dickey & Pierce, P.L.C.

(57) ABSTRACT

Disclosed is a semiconductor device with a bipolar transistor and method of fabricating the same. The device may include a collector region in a semiconductor substrate. A base pattern may be disposed on the collector region. A hard mask pattern may be disposed on the base pattern. The hard mask pattern may include a buffering insulation pattern and a flatness stopping pattern stacked in sequence. An emitter electrode may be disposed in a hole that locally exposes the base pattern, penetrating the hard mask pattern. A base electrode may contact an outer sidewall of the hard mask pattern and may be disposed on the base pattern. The flatness stopping pattern may contain an insulative material with etching selectivity to the buffering insulation pattern, the emitter electrode, and the base electrode.

10 Claims, 7 Drawing Sheets

SEMICONDUCTOR DEVICE WITH BIPOLAR TRANSISTOR AND METHOD OF FABRICATING THE SAME

PRIORITY STATEMENT

This U.S. non-provisional patent application claims priority under 35 U.S.C. § 119 to Korean Patent Application No. 2006-00620, filed on Jan. 3, 2006, in the Korean Intellectual Property Office (KIPO), the entire contents of which are hereby incorporated by reference.

BACKGROUND

1. Field

Example embodiments relate to semiconductor device and method of fabricating the same. Other example embodiments relate to a semiconductor device with a bipolar transistor and method of fabricating the same.

2. Description of Related Art

A semiconductor device has a variety of unit components (e.g., resistors, capacitors, metal-oxide-semiconductor (MOS) field effect transistors and/or bipolar transistors). Those bipolar transistors may be operable at an improved, increased frequency compared to the field effect transistors. The bipolar transistors may be more widely used in electronic devices requiring a higher-frequency operation. A conventional method for manufacturing such a bipolar transistor is as follows.

FIGS. 1 and 2 are sectional views showing a method of fabricating a conventional bipolar transistor. Referring to FIG. 1, a field isolation film 2 may be formed in a semiconductor substrate 1, defining active fields. The semiconductor substrate 1 may be doped with N-type impurities. The active fields may be correspondent with collector regions. P-type ionic impurities may be injected into the surface of the active field, forming a base layer. After depositing a first polysilicon film to contact the base layer 3 on the semiconductor substrate 1, the first polysilicon film may be patterned to form base electrode 4. The base electrode 4 may contact a top edge of the base layer 3. The top center of the base layer 3 may not be covered by the base electrode 4. The base electrode 4 and the base layer 3 may be doped with P-type impurities, conductively contacting the base layer 3. A first oxide film 5 may be deposited on the semiconductor substrate 5 and then patterned to form a hole 6 that partially exposes the base layer 3.

Referring to FIG. 2, after depositing a second polysilicon film (not shown) on the semiconductor substrate 1 to fill the hole 6, the second polysilicon film (not shown) may be patterned to form an emitter electrode 7. The emitter electrode 7 may fill the hole 6 and may contact the base layer 3. The emitter electrode 7 may be formed of polysilicon doped with N-type impurities. The emitter electrode 7 may complete an NPN bipolar transistor that is formed in a stacked structure of the collector region doped with N-type impurities, the base layer 3 doped with P-type impurities, and the emitter electrode 7 doped with N-type impurities. Before depositing the second polysilicon film, N-type ionic impurities may be injected into the top of the base layer 3 exposed by the hole 6, forming an emitter diffusion region.

A second oxide film 8 may be deposited to cover the emitter electrode 7 on the semiconductor substrate 1. The first and second oxide films 5 and 8 may be sequentially patterned to form an emitter contact hole 9a and an base contact hole 9b that expose the emitter electrode 7 and the base electrode 4, respectively. An emitter plug 10a may be formed to fill the emitter contact hole 9a and a base plug 10b may be formed to fill the base contact hole 9b. On the second oxide film 8, emitter and base interconnections 11a and 11b may be formed to contact the emitter and base plugs 10a and 10b.

According to the method of fabricating such a bipolar transistor, while forming the hole 6, the surface of the base layer 3 exposed by the hole 6 may be damaged by a plasma etching operation. An interface characteristic between the emitter electrode 7 and the base layer 3 may deteriorate causing the bipolar transistor operational characteristics to worsen.

The top of the emitter electrode 7 may be higher than the top of the base electrode 4. In other words, a height from the bottom to the top of the emitter electrode 7 may be larger than a height from the bottom to the top in the base layer 4. Emitter resistance may increase rather than base resistance. As the emitter of the bipolar transistor further includes a portion (e.g., the emitter electrode 7) that has a higher resistivity than a metal, relative to the base, the emitter resistance of the bipolar transistor may become larger than the base resistance. The bipolar transistor may deteriorate.

The emitter electrode 7 may be partially formed on the first oxide film 5. Accordingly, the emitter contact hole 9a may only penetrate the second oxide film 8, while the base contact hole 9a penetrates the first and second oxide films 5 and 8. The emitter contact hole 9a may be shallower in depth than the base contact hole 9b. During an etching operation for a complete hole structure of the emitter contact hole 9a, the emitter electrode 7 exposed by the emitter contact hole 9a may be over-etched deteriorating contact resistance between the emitter plug 10a and the emitter electrode 7.

SUMMARY

Example embodiments are proposed to solve the aforementioned problems or others relevant thereto. Example embodiments provide a semiconductor device having a bipolar transistor with improved characteristics, and a method of fabricating the semiconductor device. Example embodiments provide a semiconductor device having a bipolar transistor and a method of fabricating the same, capable of preventing or reducing deterioration of interface characteristics. Example embodiments are further directed to provide a semiconductor device having a bipolar transistor and a method of fabricating the same, capable of reducing emitter resistance.

Example embodiments provide a semiconductor device having a bipolar transistor. Example embodiments provide a semiconductor device that may include a collector region in a semiconductor substrate, a base pattern on the collector region, a hard mask pattern including a buffering insulation pattern and a flatness stopping pattern that are stacked in sequence on the base pattern; an emitter electrode in a hole that penetrates the hard mask pattern and locally exposes the base pattern, being connected with the exposed base pattern, and a base electrode on the base pattern, contacting at least a sidewall of the hard mask pattern. The flatness stopping pattern may include an insulative material with etching selectivity to the buffering insulation pattern, the emitter electrode, and the base electrode.

According to example embodiments, the emitter electrode may be leveled with the base electrode. Tops of the emitter and base electrodes may be coplanar with a top of the hard mask pattern. According to example embodiments, the semiconductor device may further include a first metal silicide film on the emitter electrode and a second metal silicide film on the base electrode. The emitter and base electrodes may be leveled lower than the flatness stopping pattern. According to example embodiments, the collector region may be doped with impurities of first conductivity, the base pattern may be formed of a semiconductor doped with impurities of second conductivity, and the emitter electrode may be doped with impurities of the first conductivity.

Example embodiments also provide a method of fabricating a semiconductor device. This method may include forming a base layer on a semiconductor substrate including a collector region, forming a hard mask pattern that includes buffering insulation and flatness stopping patterns stacked locally on the base layer, and a preliminary emitter electrode that is disposed on the hard mask pattern and fills a hole that penetrates the hard mask pattern and partially exposes the base layer, forming a base electrode film on the semiconductor substrate, flattening the base electrode film and the preliminary emitter electrode until exposing the hard mask pattern to form an emitter electrode in the hole, and continuously patterning the flattened base electrode film and the base layer and forming a base pattern and a base electrode that contacts at least a sidewall of the hard mask pattern on the base pattern.

According to example embodiments, forming the hard mask pattern and the preliminary emitter electrode may be comprised of forming a hard mask film including buffering insulation and flatness stopping films stacked in sequence on the base layer, forming the hole to penetrate the hard mask film and partially expose the base layer, forming an emitter electrode film to fill the hole on the semiconductor substrate, and continuously patterning the emitter electrode film and the hard mask film to form the hard mask pattern and the emitter electrode. Forming the hole may be comprised of patterning the flatness stopping film to form a preliminary hole that partially exposes the buffering insulation film, and removing the exposed buffering insulation film by a wet etch to form the hole. The method may be further comprised of forming a spacer on an inner sidewall of the preliminary hole before conducting the wet etch.

According to example embodiments, the flatness stopping pattern may include an insulative material with etching selectivity to the buffering insulation pattern, the preliminary emitter electrode, and the base electrode film. According to example embodiments, the method may be further comprised of conducting silicidation to form first and second metal silicide films on the emitter and base electrodes, respectively.

According to example embodiments, the semiconductor substrate may be a silicon substrate and the collector region may be doped with impurities of first conductivity. The base layer may be formed of a silicon-germanium layer doped with impurities of second conductivity and the emitter electrode may be formed of a silicon layer doped with impurities of the first conductivity. The base electrode film may be made of silicon doped with impurities of the second conductivity. A further understanding of the nature and advantages of example embodiments herein may be realized by reference to the remaining portions of the specification and the attached drawings.

BRIEF DESCRIPTION OF THE FIGURES

Example embodiments will be more clearly understood from the following detailed description taken in conjunction with the accompanying drawings.

FIGS. 1 and 2 are sectional views showing a method of fabricating a conventional bipolar transistor;

FIG. 3 is a sectional view illustrating a semiconductor device having a bipolar transistor in accordance with example embodiments;

FIG. 4 is a sectional view illustrating a modification of the semiconductor device having the bipolar transistor in accordance with example embodiments;

FIGS. 5-11 are sectional views illustrating a method of fabricating the semiconductor device shown in FIG. 3; and FIGS. 12-14 are sectional views illustrating a method of fabricating the semiconductor device shown in FIG. 4.

DETAILED DESCRIPTION OF EXAMPLE EMBODIMENTS

Figure 1:
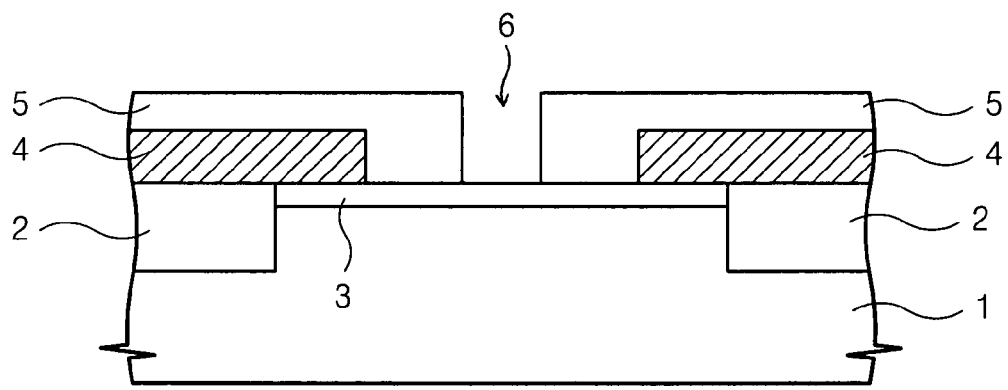
FIGS. 1-14 represent non-limiting, example embodiments as described herein.
Figure 2:
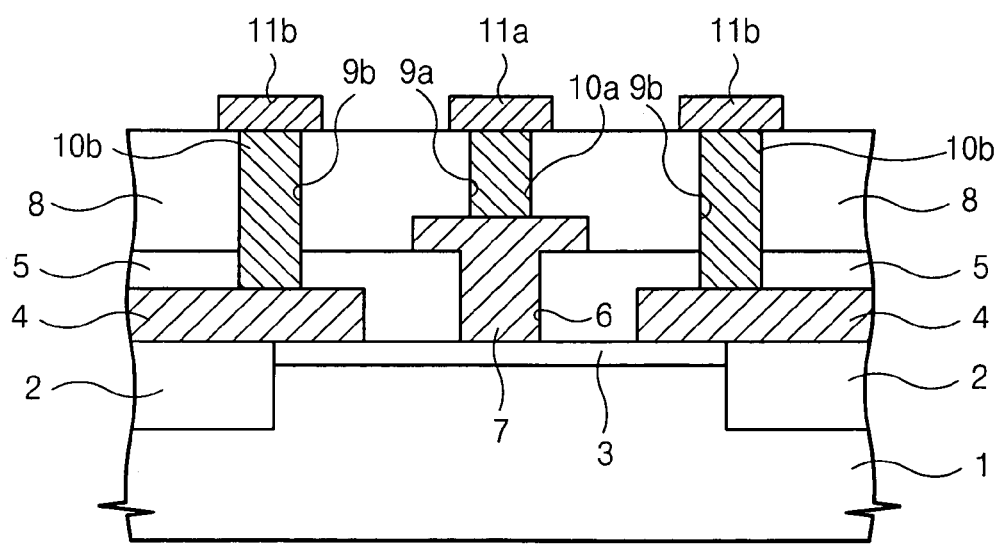

Example embodiments will be described below in more detail with reference to the accompanying drawings. Example embodiments may, however, be embodied in different forms and should not be constructed as limited to the embodiments set forth herein. Rather, these embodiments are provided so that this disclosure will be thorough and complete, and will fully convey the scope of example embodiments to those skilled in the art.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between" and/or "adjacent" versus "directly adjacent").

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath", "below", "lower", "above", "upper" and the like, may be used herein for ease of description to describe one element or a feature's relationship to another element or feature as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
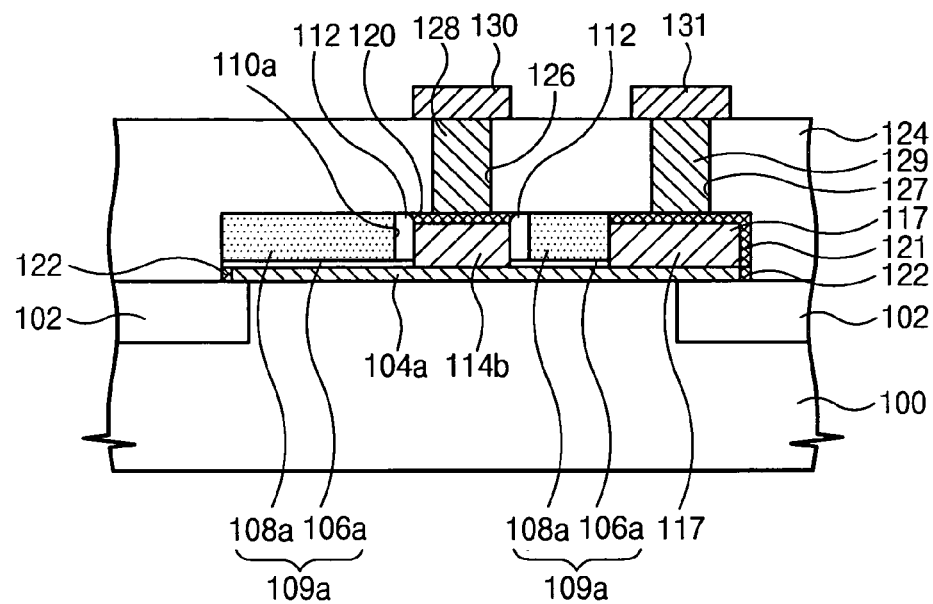

FIG. 3 is a sectional view illustrating a semiconductor device having a bipolar transistor in accordance with example embodiments. Referring to FIG. 3, a field isolation film 102 may be formed in a semiconductor substrate 100, defining active fields. The active fields may correspond with collector regions. The semiconductor substrate 100 may be a silicon substrate. The collector region may be doped with impurities of a first conductivity. A well (not shown) doped with the first-conductivity impurities may be disposed in the semiconductor substrate 100 and the field isolation film 102 may be in the well. The field isolation film 102 may be formed shallower than the well. Accordingly, the collector region may be able to conductively contact with the semiconductor substrate 100 (e.g., a portion of the well).

A base pattern 104a may be disposed on the collector region. The base pattern 104a may be on top of the collector region. The base pattern 104a may be on an edge of the field isolation film 102 adjacent to the collector region. The base pattern 104a may contact with the top of the collector region (e.g., the active field). The base pattern 104a may be formed of a semiconductor doped with impurities of a second conductivity. The base pattern 104a may be made of silicon-germanium doped with the second-conductivity impurities. A portion of the base pattern 104a, on the collector region, may be made of a single crystalline silicon-germanium layer, while the other portion of the base pattern 104a on the field isolation film 102 may be made of a polycrystalline silicon-germanium layer.

A hard mask pattern 109a may be disposed on the base pattern 104a. The hard mask pattern 109a may be formed of a buffering insulation pattern 106a and a flatness stopping pattern 108a sequentially stacked. The flatness stopping pattern 108a may include an insulation material with an etching selectivity to the buffering insulation pattern 106a. The buffering insulation pattern 106a may be formed of an insulation material, e.g., oxide, providing minimum or reduced stress to the base pattern 106a. The buffering insulation pattern 106a may not be as thick as the flatness stopping pattern 108a.

An emitter electrode 114b may penetrate the hard mask pattern 109a and may be disposed in a hole 10a exposing the base pattern 104a. The emitter electrode 114b may contact the base pattern 104a exposed by the hole 110a. The emitter electrode 114b may be formed of a semiconductor doped with the first-conductivity impurities. For example, the emitter electrode 114b may be formed of silicon doped with the first-conductivity impurities. The emitter electrode 114b may be formed of polycrystalline silicon doped with the first-conductivity impurities.

The emitter electrode 114b, the collector region (not shown), and the base pattern 104a under the emitter electrode 114b may constitute a bipolar transistor. The first-conductivity impurities may be N-type impurities while the second-conductivity impurities may be P-type impurities. The bipolar transistor may be formed in an NPN type. Otherwise, when the first-conductivity impurities are P-type impurities and the second-conductivity impurities are N-type impurities, the bipolar transistor may be formed in a PNP type.

A base electrode 117 may be on the base pattern 104a on a side of the hard mask pattern 109a. The base electrode 117 may contact the top of the base pattern 104a on a side of the hard mask pattern 109a. The base electrode 117 may also contact a first sidewall of the hard mask pattern 109a. The base electrode 117 may be formed of a semiconductor doped with the second-conductivity impurities. The base electrode 117 may be made of silicon (e.g., polycrystalline silicon) doped with the second-conductivity impurities. The base electrode 117 may be doped in the same impurity type as the base pattern 104a, conductively contacting the base pattern 104a.

The hard mask pattern 109a may include a first sidewall contacting the base electrode 117, and a second sidewall not contacting the base electrode 117. The base electrode 117 may include a first electrode sidewall contacting the first sidewall of the hard mask pattern 109a, and a second electrode sidewall opposite to the first electrode sidewall. The second electrode sidewall of the base electrode 117 may not contact the hard mask pattern 109a. The second sidewall of the hard mask pattern 109a and the second electrode sidewall of the base electrode 117 may be disposed on the field isolation film 102. The first sidewall of the hard mask pattern 109a and the first electrode sidewall of the base electrode 117 may be on the collector region.

The base pattern 104a may include a first pattern sidewall aligned with the second sidewall of the hard mask pattern 109a, and a second pattern sidewall aligned with the second electrode sidewall of the base electrode 117. The hard mask pattern 109a and the base electrode 117 may be laterally arranged in sequence on the base pattern 104a. The emitter electrode 114b may be disposed in the hole 110a penetrating the hard mask pattern 109a, contacting the base pattern 103a. The flatness stopping pattern 108a may be formed of an insulative material with an etching selectivity to the emitter electrode 114b and the base electrode 117. The flatness stopping pattern 108a may be formed of an insulative material with an etching selectivity to the buffering insulation pattern 106a, the emitter electrode 114b, and the base electrode 117. For example, the flatness stopping pattern 108a may be formed of a nitride film and/or an oxynitride film.

The top of the emitter electrode 114b may be flattened along with the top of the base electrode 117. In other words, the emitter electrode 114b may be leveled with the base electrode 117. The tops of the emitter and base electrodes 114b and 117 may be leveled close to the top of the hard mask pattern 109a (e.g., the top of the flatness stopping pattern 108a). The tops of the emitter and base electrodes 114b and 117 may be leveled with and/or higher than the top of the hard mask pattern 109a.

A first metal silicide film 120 may be formed on the top of the emitter electrode 114b. A second metal silicide film 121 may be formed on the top of the base electrode 117. The second metal silicide film 121 may be on the second electrode sidewall of the base electrode 117. The first and second metal silicide films 120 and 121 may be electrically isolated from each other. A third metal silicide film 122 may be formed on the pattern sidewalls of the base pattern 104a. The first, second, and third metal silicide films 120, 121, and 122 may include the same metal component. For example, the first, second, and third metal silicide films, 120, 121, and 122, may contain cobalt, nickel and/or titanium.

With the metal silicide films 120, 121, and 122, the tops of the emitter and base electrodes 114b and 117 may be leveled lower than the top of the hard mask pattern 109a. Without the metal silicide films 120, 121, and 122, the tops of the emitter and base electrodes 114b and 117 may be coplanar with the top of the hard mask pattern 109a. The tops of the emitter and base electrodes 114b and 117 may be leveled with the top of the hard mask pattern 109a.

An inner sidewall of the hole 110a may include an upper inner sidewall formed of the flatness stopping pattern 108a, and a lower inner sidewall formed of the buffering insulation pattern 106a. In this structure, spacers 112 may be disposed between the emitter electrode 114b and the upper inner sidewalls of the hole 110a. The spacers 112 may be formed of a material with an etching selectivity to the buffering insulation pattern 106a. For example, the spacers 112 may be made of silicon nitride, silicon oxynitride and/or undoped silicon. The buffering insulation pattern 106a may extend laterally under the spacers 112 and the lower inner sidewall of the hole 110a may be interposed or inserted between the spacers 112 and the base pattern 104a.

On the other side, the spacers 112 may be absent therein. The lower inner sidewall of the hole 110a may be interposed or inserted between the flatness stopping pattern 108a and the base pattern 104a. The lower inner sidewall of the hole 110a may be recessed laterally more than the upper inner sidewall thereof. An interlevel insulation film 124 may be on the semiconductor substrate 100 including the hard mask pattern 109a, the emitter electrode 114b, and the base electrode 117. The interlevel insulation film 124 may be formed of an oxide film.

An emitter plug 128 may penetrate the interlevel insulation film 124, filling an emitter contact hole 126 that exposes the first metal silicide film 120. A base plug 129 may penetrate the interlevel insulation film 124, filling a base contact hole 127 that exposes the second metal silicide film 121 on top of the base electrode 117. The emitter and base plugs 128 and 129 may be spaced laterally from each other and electrically isolated from each other. Although not shown, a collector plug may penetrate the interlevel insulation film 124, being connected to the collector region. A conductive buffering pattern may be disposed between the collector region and the collector plug. Between the plugs 128 and 129 and the electrodes 114b and 117, the metal silicide films 120 and 121 may be interposed or inserted to lower contact resistance therebetween, which may allow a bipolar transistor operable at an increased frequency.

The emitter and base plugs 128 and 129 may be formed of a conductive material. Specifically, the emitter and base plugs 128 and 129 may be formed of a conductive material that is lower than doped silicon in resistivity. For example, the emitter and base plugs 128 and 129 may include at least one selected from conductive metallic nitride (e.g., titanium nitride and/or tantalum nitride) and metal (e.g., tungsten, copper and/or aluminum). According to the semiconductor device including the bipolar transistor aforementioned, the top of the emitter electrode 114b may be leveled with the top of the base electrode 117. Plasma etching damage on the emitter electrode due to a gap of heights between the conventional emitter and base electrodes may be prevented or reduced. An interface characteristic between the emitter electrode 114b and the base pattern 104a may be enhanced. A relative increase of emitter resistance that has been caused by the relatively large height of the conventional emitter electrode may be prevented or reduced.

As the hard mask pattern 109a is partially interposed or inserted between the base electrode 114b and the emitter electrode 117, the base electrode 117 may be sufficiently spaced from the emitter electrode 117, improving an insulation characteristic between the base and emitter electrodes 114b and 117. Specifically, this sufficient isolation distance between the emitter and base electrodes 114b and 117 minimizes or reduces parasitic capacitance between the emitter and base electrodes 114b and 117, which prevents or reduces characteristic deterioration in the bipolar transistor.

The spacer 112 contributes to reducing an area of the base pattern 104a exposed by the hole 110a. The spacer 112 decreases a contact area between the emitter electrode 114b and the base pattern 104a. It further enhances an operation speed of the bipolar transistor. When the hole 110a is formed in the minimum line width definable by a photolithography process, the spacers 112 may be helpful to implement the base pattern 104a, which is exposed by the hole 110a, in a width smaller than the minimum line width definable by the photolithography process. The spacer 112 functions to further extend the distance between the emitter electrode 114b and the base electrode 117.

The buffering insulation pattern 106a and the flatness stopping pattern 108a, which constitute the hard mask pattern 109a, have etching selectivity to each other. The buffering insulation pattern 106a may be smaller than the flatness stopping pattern 108a in thickness. Plasma etching damage on the base pattern 104a exposed by the hole 110a may be prevented or reduced. In the semiconductor device aforementioned, the base electrode 117 may contact the sidewall of the hard mask pattern 109a. The base electrode may contact with both sidewalls of the hard mask pattern. This modification will be described with reference to FIG. 4. The modified embodiment is similar to that shown in FIG. 3, so will be detailed about the characterized features therein.

Figure 4:
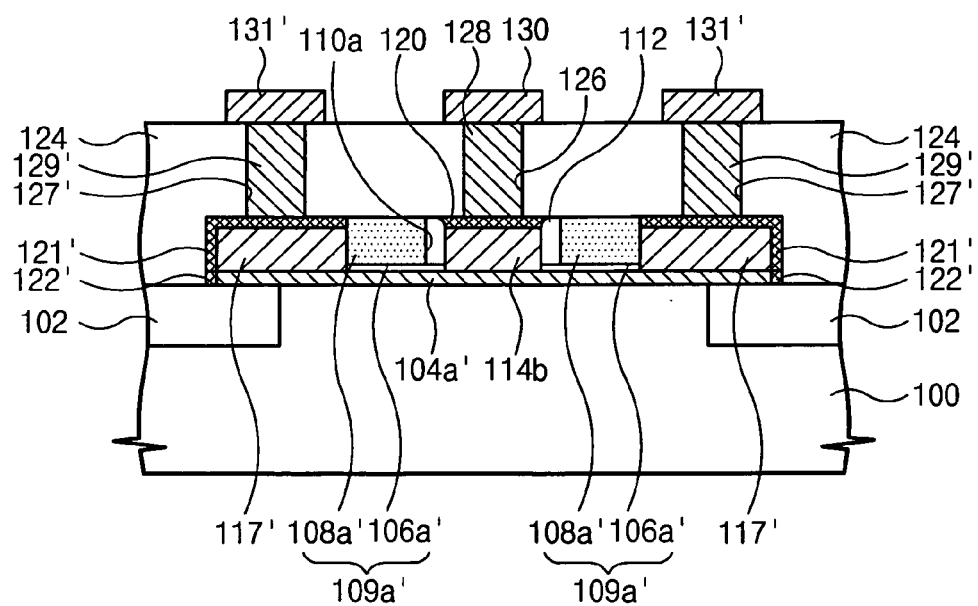

FIG. 4 is a sectional view illustrating a modification of the semiconductor device having the bipolar transistor in accordance with example embodiments. Referring to FIG. 4, a hard mask pattern 109a' may be disposed on the base pattern 104a'. The hard mask pattern 109a' may be placed on the top center of the base pattern 104a'. The hard mask pattern 109a' may be composed of a buffering insulation pattern 106a' and a flatness stopping pattern 108a' stacked thereon in sequence. The base pattern 104a', the buffering insulation pattern 106a', and the flatness stopping pattern 108a' may be formed of the same material with the base pattern 104a, the buffering insulation pattern 106a, and the flatness stopping pattern 108a shown in FIG. 3.

The emitter electrode 114b may be disposed in the hole 110a that penetrates the hard mask pattern 109a' and may partially expose the base pattern 104a'. The emitter pattern 114b also may contact the base pattern 104a' exposed by the hole 110a. The spacer 112 may be interposed or inserted between the emitter electrode 114b and the upper inner sidewall of the hole 110a. A base electrode 117' may be placed on both sides of the hard mask pattern 109a'. The base electrode 117' also may contact the top of the base pattern 104a' on both sides of the hard mask pattern 109a'. The base electrode 117' may contact to all the sidewalls of the hard mask pattern 109a'. In other words, the base electrode 117' may be configured to enclose the entire sidewall of the hard mask pattern 109a'. The base electrode 117' may be comprised of a first electrode sidewall contacting the sidewall of the hard mask pattern 109a', and a second electrode sidewall opposite to the first electrode sidewall. By such disposition of the base electrode 117' on both sides of the hard mask pattern 109a', the base electrode 117' may be thereby comprised of first dual electrode sidewalls contacting both sidewalls of the hard mask pattern 109a', and second dual electrode sidewalls opposite to the first dual electrode sidewalls. The second dual electrode sidewalls may be disposed between the first dual electrode sidewalls and both sidewalls of the hard mask pattern 109a'.

The base pattern 104a' may be comprised of a sidewall aligned to the second electrode sidewall of the base electrode 117'. The base pattern 104a' may be comprised of both sidewalls opposite to the second dual electrode sidewalls of the base electrode 117'. The sidewall of the hard mask pattern 109a' may be placed on the top of the collector region. The second electrode sidewall of the base electrode 117' may be disposed on the field isolation film 102. The sidewall of the base pattern 104a' may be placed on the field isolation film 102.

The first metal silicide film 120 may be formed on the emitter electrode 114b while a second metal silicide film 121' is formed on the base electrode 117'. The second metal silicide film 121' may extend onto the second electrode sidewall of the base electrode 117'. A third metal silicide film 122' may be formed on the sidewall of the base pattern 104a'. The first, second, and third metal silicide films, 120, 121', and 122', may include the same metal (e.g., cobalt, nickel and/or titanium). The first, second, and third metal silicide films, 120, 121', and 122', may be made of cobalt silicide, nickel silicide and/or titanium silicide.

The interlevel insulation film 124 may cover the semiconductor substrate 100. The emitter plug 128 may fill the emitter contact hole 126 that penetrates the interlevel insulation film 124 and exposes the metal silicide film 120, conductively contacting the emitter electrode 114b. A base plug 129' may fill a base contact hole 127' that penetrates the interlevel insulation film 124 and exposes the second metal silicide film 121' on the base electrode 117', conductively contacting the base electrode 117'. The base plugs 129' may be disposed on the sides of the emitter plug 128. The first base plug 129' may be conductively connected to a first portion of the base electrode 117' that is placed on the first side of the hard mask pattern 109a', while the second base plug 129' is conductively connected to a second portion of the base electrode 117' that is placed on the second side of the hard mask pattern 109a'.

On the interlevel insulation film 124, an emitter interconnection 130 may be disposed to be connected to the emitter electrode 128. On the interlevel insulation film 124, a base interconnection 131' may be disposed to be connected to the base plug 129'. On the interlevel insulation film 124, first and second base interconnections 131' may be disposed to be connected to the base plugs 129'. The base interconnection 131' may be electrically isolated from the emitter interconnection 130. The first and second base interconnections 131' may be conductively connected with each other. Otherwise, the first and second base interconnections 131' may be supplied with the same operation voltage.

Figure 5:
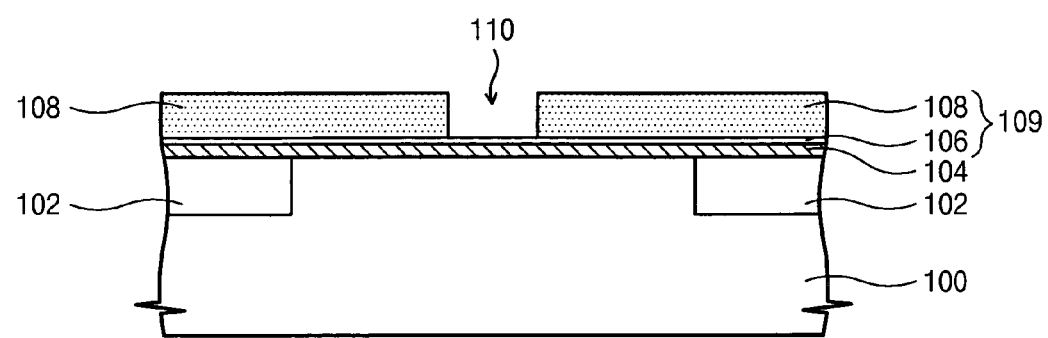

A procedure of fabricating the bipolar transistor of example embodiments will now be described. FIGS. 5-11 are sectional views illustrating a method of fabricating the semiconductor device shown in FIG. 3. Referring to FIG. 5, the field isolation film 102 may be formed in the semiconductor substrate 100, defining the active fields. The active fields may correspond to the collector regions. The collector regions may be doped with the first-conductivity impurities. The semiconductor substrate 100 may be doped with the first-conductivity impurities. After forming the well of the first conductivity by implanting the first-conductivity impurities into the semiconductor substrate 100, the field isolation film 102 may be formed in the well to define the collector regions. The bottom of the field isolation film 102 may be shallower than the bottom of the well. The semiconductor 102 may be formed of a silicon substrate.

A base layer 104 may be deposited on the semiconductor substrate 100. The base layer 104 may contact the collector region. The base layer 104 may be formed of a semiconductor doped with the second-conductivity impurities. The base layer 104 may be made of silicon-germanium doped with the second-conductivity impurities. The base layer 104 may be formed by means of epitaxial growth. Accordingly, a part of the base layer 104 on the collector region may be formed of single crystalline silicon-germanium, while another part of the base layer 104 on the field isolation film 102 may be formed of polycrystalline silicon-germanium. The base layer 104 may be doped in-situ. A hard mask film 109 may be deposited on the base layer 104. The hard mask film 109 may be composed of a buffering insulation film 106 and a flatness stopping film 108 stacked in sequence. The buffering insulation film 106 may be formed of an insulative material that provides minimum or reduced stress to the base layer 104. For example, the buffering insulation film 106 may be made of oxide. The flatness stopping film 108 may be formed of an insulative material with etching selectivity to the buffering insulation film 106. The buffering insulation film 106 may be less thick than the flatness stopping film 108. The flatness stopping film 108 may be patterned to a preliminary hole 110 to partially expose the buffering insulation film 106.

Figure 6:
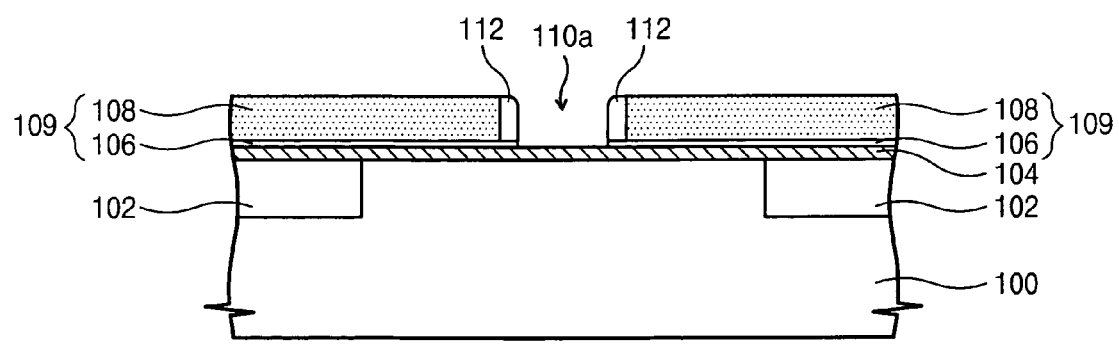

Referring to FIG. 6, spacers 112 may be formed on inner sidewalls of the preliminary hole 110. The spacers 112 may be formed of a material with etching selectivity to the buffering insulation film 106. The spacer 112 may be formed of a material with etching selectivity even to the flatness stopping film 108, as well as to the buffering insulation film 106. For example, the spacer 112 may be made of nitride, oxynitride and/or undoped silicon.

The buffering insulation film 106 exposed between the spacers 112 may be removed to form the hole 110a that partially exposes the base layer 104. A wet etching operation may remove the exposed buffering insulation film 106. In forming the hole 110a, an etching stopper with the buffering insulation film 106 may be helpful to minimize or reduce plasma etching damage on the base layer 104 exposed by the hole 110a. As the exposed buffering insulation film 106 is removed by the wet etching operation, the aforementioned plasma etching damages that would be generated on the base layer 104 exposed by the hole 10a may be prevented or reduced.

With the spacers 112, the base layer 104 exposed by the hole 110a may be more reduced in area rather than the preliminary hole 110. When a width of the preliminary hole 110 is formed in the minimum line width definable by a photolithography process, the spacers 112 may be helpful to implement the base layer 104, which is exposed by the hole 110a, in a width smaller than the minimum line width definable by the photolithography process. The step of forming the spacers 112 may be skipped. After completing the preliminary hole 110, the buffering insulation film 106 exposed by the preliminary hole 110 may be removed by means of wet etch to form the hole 10a.

Figure 7:
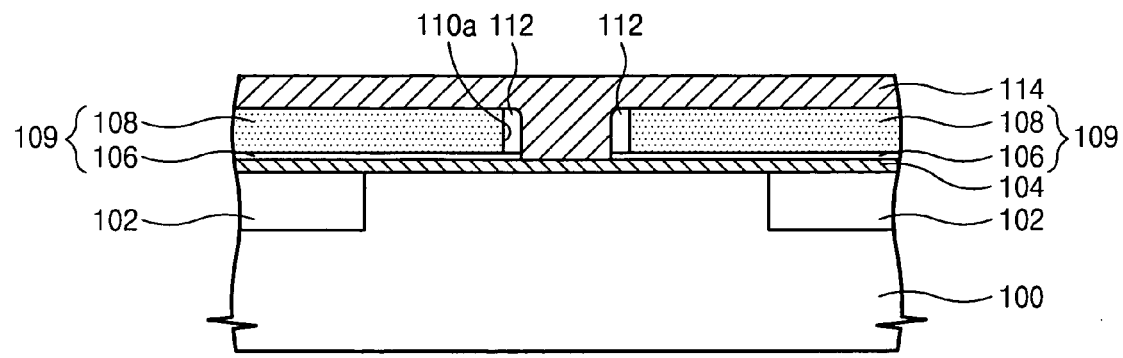

Referring to FIG. 7, an emitter electrode film 114 may be formed on the semiconductor substrate 100, filling the hole 110a. The emitter electrode film 114 may contact the base layer 104 exposed by the hole 110a. The emitter electrode film 114 may be made of a semiconductor doped with the first-conductivity impurities. The emitter electrode film 114 may be formed of silicon (esp., polycrystalline silicon) doped with the first-conductivity impurities.

Figure 8:
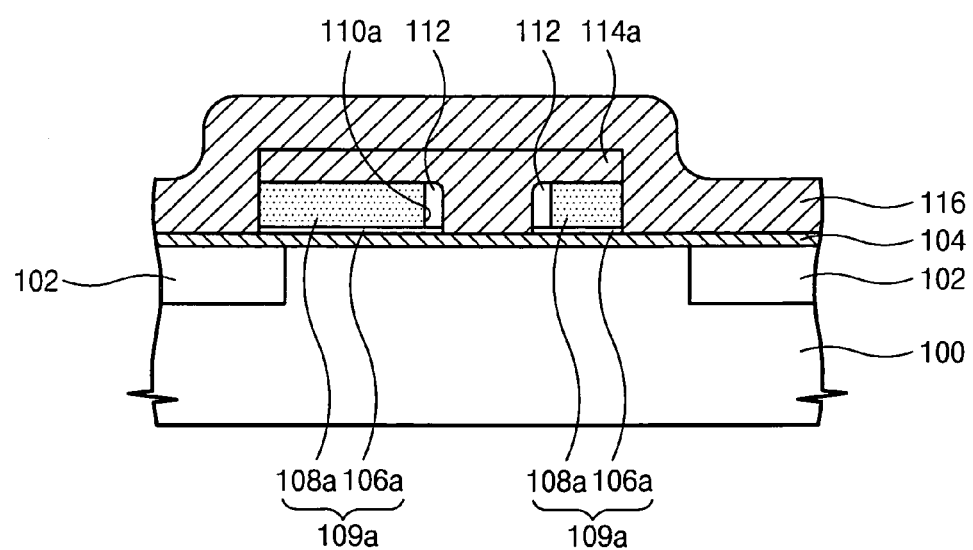

Referring to FIG. 8, the base layer 104, the emitter electrode film 114 and the hard mask film 109 may be patterned to form the hard mask pattern 109a and a preliminary emitter electrode 114a. The hard mask pattern 109a may include the hole 110a. The spacers 112 may be disposed adjacent to the upper inner sidewalls of the hole 110a. The preliminary emitter electrode 114a may be disposed on the hard mask pattern 109a and may fill the hole 110a of the hard mask pattern 109a. The preliminary emitter electrode 114a may be connected with the base layer 104 exposed by the hole 110a. The portion of the preliminary emitter electrode 114a, which is placed on the hard mask pattern 109a, may have a sidewall aligned with the sidewall of the hard mask pattern 109a. The hard mask pattern 109a may be composed of the buffering insulation pattern 106a and the flatness stopping pattern 108a stacked in sequence. The hard mask pattern 109a may be comprised of the first and second sidewalls. The first sidewall of the hard mask pattern 109a may be disposed on the collector region, while the second sidewall of the hard mask pattern 109a may be disposed on the field isolation film 102. In forming the hard mask pattern 109a, as the buffering insulation film 106 is used as an etch-stopping layer, plasma etching damage on the base layer 104, exposed on both sides of the hard mask pattern 109a, may be lessened.

A base electrode film 116 may be deposited on the semiconductor substrate 100. The base electrode film 116 may be formed of a semiconductive layer doped with the second-conductivity impurities as like the base layer 104. For example, the base electrode film 116 may be made of silicon (e.g., polycrystalline silicon) doped with the second-conductivity impurities. The base electrode film 116 may cover the preliminary emitter electrode 114a and the hard mask pattern 109a. The base electrode film 116 may contact the first and second sidewalls of the hard mask pattern 109a. The base electrode film 116 also may contact the base layer 104 exposed on both sides of the hard mask pattern 109a. The base electrode film 116 on the exposed base layer 104 may be higher than the hard mask pattern 109a in thickness. The flatness stopping pattern 108a may be formed of an insulative material with etching selectivity even to the preliminary emitter electrode 114a and the base electrode film 116, as well as to the buffering insulation pattern 106a. For example, the flatness stopping pattern 108a may be made of nitride and/or oxynitride.

Figure 9:
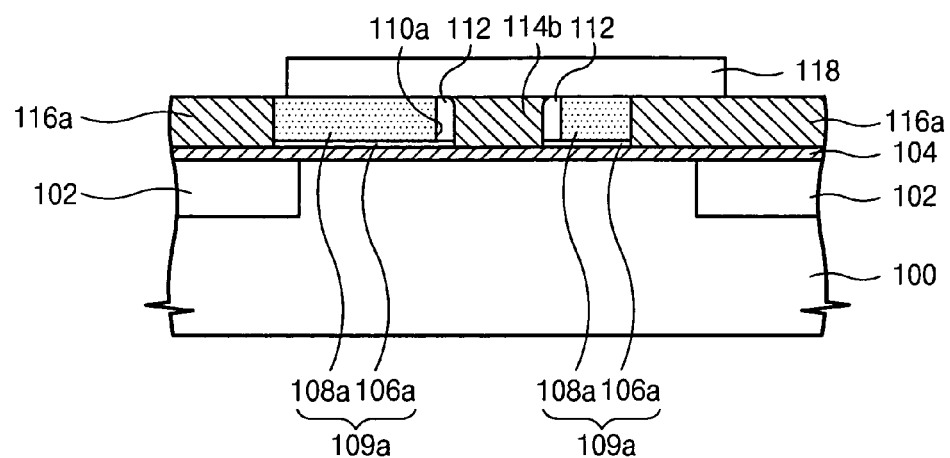

Referring to FIG. 9, the base electrode film 116 and the preliminary emitter electrode 114a may be flattened until the hard mask pattern 109a is exposed, resulting in the emitter electrode 114b to fill the hole 10a. Flattened base electrode films 116a may be formed on both sides of the hard mask pattern 109a. Flattening the base electrode film 116 and the preliminary emitter electrode 114a may be carried out by means of a chemical-mechanical polishing (CMP) operation. The top of the flattened base electrode film 116a may be coplanar with the top of the emitter electrode 114b and the top of the hard mask pattern 109a.

A mask pattern 118 may be formed on the semiconductor substrate 100 including the emitter electrode 114b. The mask pattern 118 may cover the emitter electrode 114b. The mask pattern 118 may partially cover the flattened base electrode film 116a located on a side (esp., a side of the first sidewall) of the hard mask pattern 109a. The flattened base electrode film 116a may be exposed on a side of the second sidewall of the hard mask pattern 109a. The mask pattern 118 may cover the hard mask pattern 109a. The top of the hard mask pattern 109a may be partially exposed, which contributes to assuring an alignment margin between the mask pattern 118 and the hard mask pattern 109a.

Figure 10:
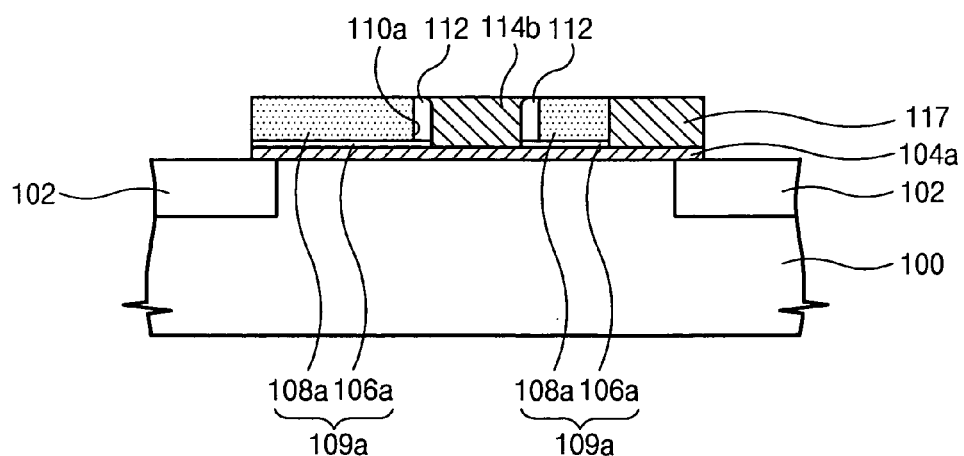

Referring to FIG. 10, using the mask pattern 118 for an etching mask, the flattened base electrode film 116a and the base layer 104 may be sequentially patterned to form the base pattern 104a and the base electrode 117. During the etching operation, because the hard mask pattern 109a may be made of an insulation material with etching selectivity to the flattened base electrode film 116a, the hard mask pattern 109a may be used as the etching mask along with the mask pattern 118 even when its top is partially exposed. The base electrode 117 may contact the first sidewall of the hard mask pattern 118. The flattened base electrode 116a may be removed from the second sidewall of the hard mask pattern 109a. The second sidewall of the hard mask pattern 109a may be exposed. A sidewall of the base pattern 104a may be placed on the field isolation film 102. Plasma etching damages on the collector region, while etching the base pattern 104a, may be prevented or reduced. The mask pattern 118 may be removed to expose the tops of the hard mask pattern 109a, the emitter electrode 114b, and the base electrode 117.

Figure 11:
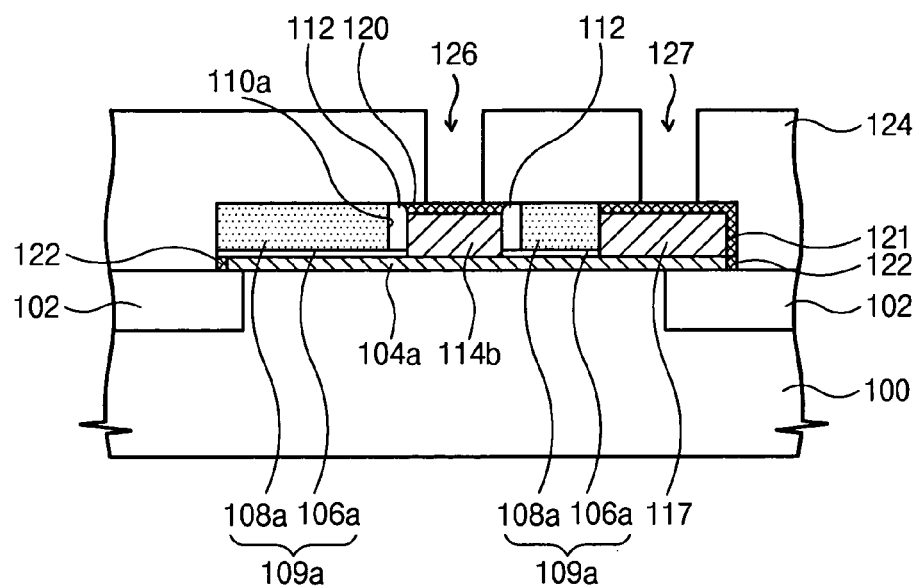

Referring to FIG. 11, silicidation may be carried out on the semiconductor substrate 100. The first metal silicide film 120 may be formed on the exposed top of the emitter electrode 114b, while the second metal silicide film 121 is formed on the exposed top and sidewall of the base electrode 117. The third metal silicide film 122 may be formed on the exposed sidewall of the base pattern 104a. The process of silicidation may proceed through depositing a metal film on the semiconductor substrate 100 and conducting thermal treatment on the semiconductor substrate 100 to make the metal film react with the exposed emitter electrode 114b, base electrode 117, and base pattern 104a, resulting in the first, second, and third metal silicide films 120, 121, and 122 thereon. Subsequently, under-reacted metal films may be removed therefrom. The steps of depositing the metal film and conducting the thermal treatment may be carried out in-situ.

The interlevel insulation film 124 may be formed on the semiconductor substrate 100. The interlevel insulation film 124 may be formed of oxide. The interlevel insulation film 124 may be patterned to form the emitter contact hole 126, which exposes the first metal silicide film 120, and the base contact hole 127 that exposes the second metal silicide film 121 on the base electrode 117. The emitter and base plugs 128 and 129 may be formed to each fill the emitter and base contact holes 126 and 127, and the emitter and base electrodes 130 and 131 may be formed as shown in FIG. 3.

According to the aforementioned method of fabricating the semiconductor device with the bipolar transistor, the hole 110a may be formed by using the buffering insulation film 106 for the etch-stopping layer. Plasma etching damages on the base layer 104, exposed by the hole 110a may be minimized or reduced. As the buffering insulation film 106 exposed by the preliminary hole 110 is removed by means of wet etching, plasma etching damages on the base layer 104, exposed by the hole 110a, may be prevented or reduced.

The flatness stopping pattern 108a, the base electrode 116 and the preliminary emitter electrode 114a may be flattened to make the emitter electrode 114b and the base electrode 117 level to each other. Plasma etching damages, on the emitter electrode, which would be caused by formation of the emitter and base contact holes and/or by a relative increase of emitter resistance due to the different heights between the conventional emitter and base electrodes, may be prevented or reduced.

As the hard mask pattern 109a is partially interposed or inserted between the base and emitter electrodes 117 and 114b, the emitter and base electrodes 114b and 117 may be sufficiently isolated from each other. Parasitic capacitance between the emitter and base electrodes 114b and 117 may be minimized or reduced, preventing or reducing characteristic deterioration in the bipolar transistor.

Figure 12:
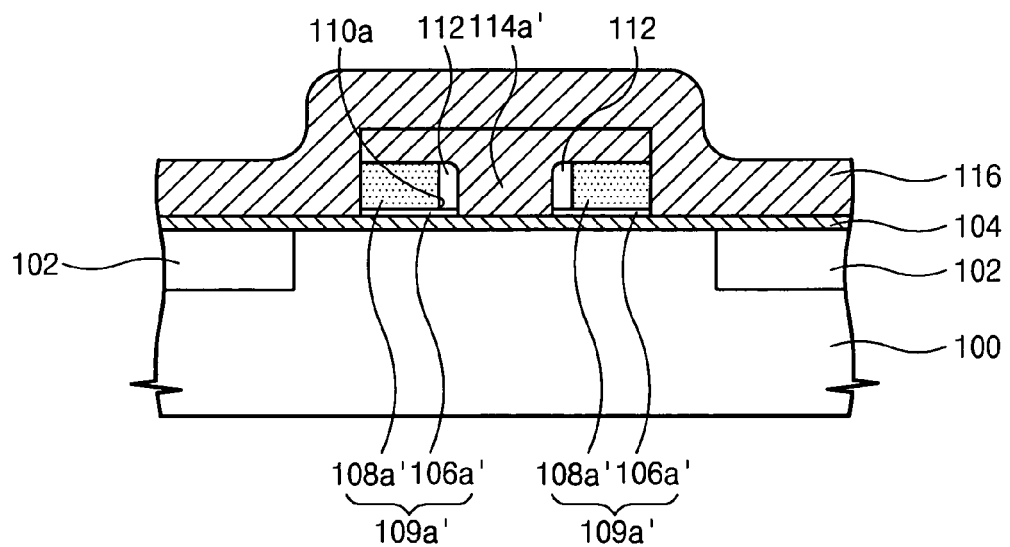
Figure 13:
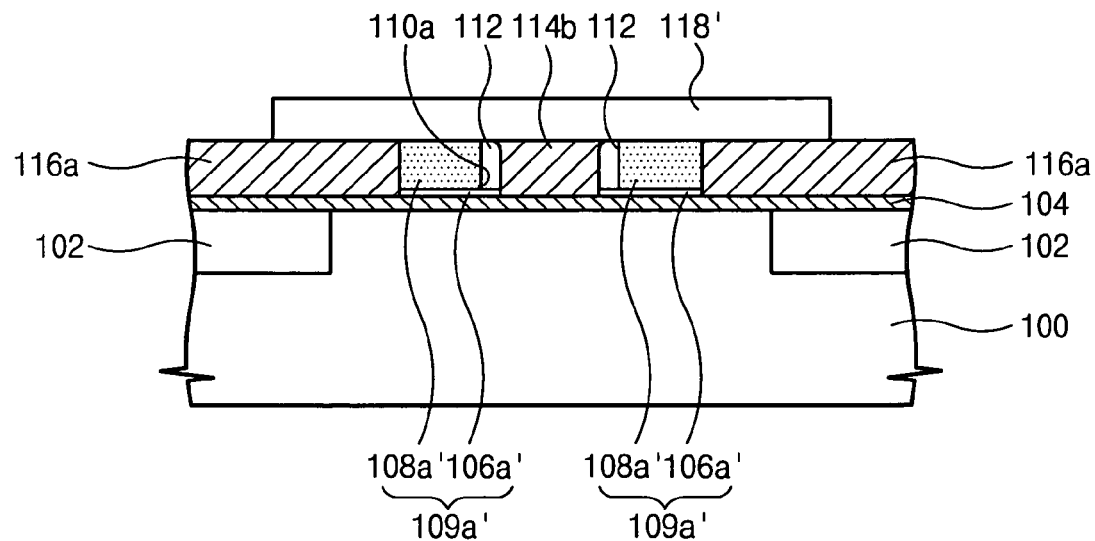
Figure 14:
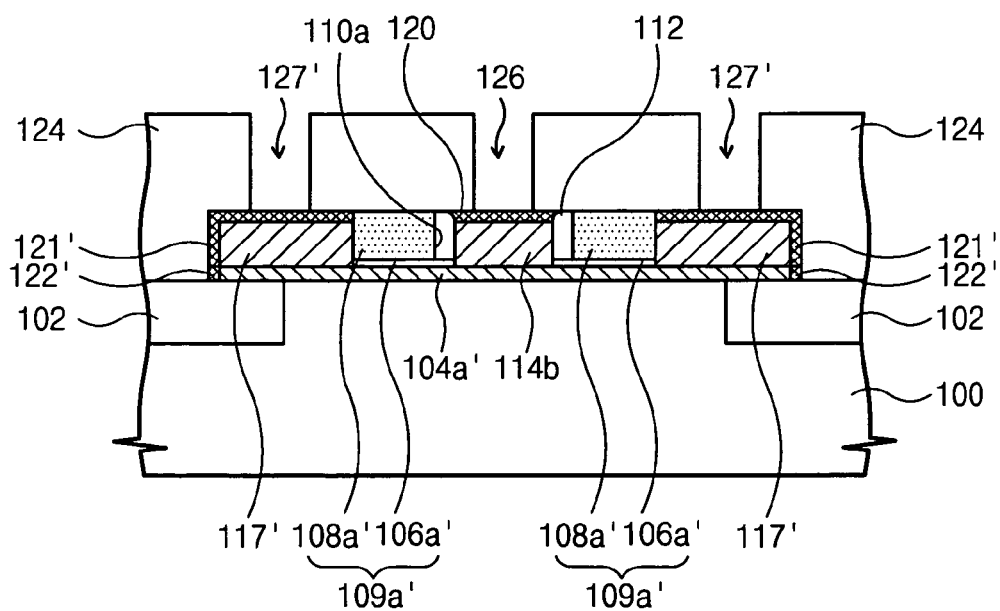

Now will be described about a method of fabricating the semiconductor device shown in FIG. 4. This method may include the aforementioned processing manners described with reference to FIGS. 5-7. FIGS. 12-14 are sectional views illustrating a method of fabricating the semiconductor device shown in FIG. 4. Referring to FIGS. 7 and 12, the emitter electrode film 114 and the hard mask film 109 may be continuously patterned to form the hard mask pattern 109a' and the preliminary emitter electrode 114a' stacked in sequence. The hard mask pattern 109a' may be composed of the buffering insulation pattern 106a' and the flatness stopping pattern 108a' stacked in sequence. The hard mask pattern 109a' may include the hole 110a. The spacers 112 cover the upper inner sidewalls of the hole 110a. The hard mask pattern 109a' may be disposed on the top center of the collector region. Both sidewalls of the hard mask pattern 109a' may be disposed on the collector region. All sidewalls of the hard mask pattern 109a' may be placed on the collector region.

The preliminary emitter electrode 114a' fills the hole 110a that penetrates the hard mask pattern 109a', covering the top of the hard mask pattern 109a'. The preliminary emitter electrode 114a' has a sidewall aligned to the sidewall of the hard mask pattern 109a'. The base layer 104 may be exposed around the hard mask pattern 109a'. The base electrode film 116 may be formed on the semiconductor substrate 100. The base electrode film 116 may be formed with the same material in the same way, as same as the feature shown in FIG. 8. The base electrode film 116 may contact the top and sidewall of the preliminary emitter electrode 114a' and the sidewall of the hard mask pattern 109a'. The base electrode film 116 also may contact the base layer 104 exposed around the hard mask pattern 109a'. The base electrode film 116 may be higher than the hard mask pattern 109a' in thickness.

Referring to FIG. 13, the base electrode film 116 and the preliminary emitter electrode 114a' may be flattened until exposing the hard mask pattern 109a', resulting in the emitter electrode 114b and the flattened base electrode film 116a. The emitter electrode 114b fills the hole 110a and the flattened base electrode films 116a may be formed to encompass the hard mask pattern 109a'. Flattening the base electrode film 116 and the preliminary emitter electrode 114a' may be carried out by means of a CMP operation. The top of the flattened base electrode film 116a may be coplanar with the top of the emitter electrode 114b and the top of the hard mask pattern 109a'. In other words, the tops of the emitter electrode 114b, the hard mask pattern 109a', and the flattened base electrode film 116a may be arranged in the same level.

A mask pattern 118' may be formed on the semiconductor substrate 100. The mask pattern 118' may be made of photoresist. The mask pattern 118' may cover the emitter electrode 114b, and the hard mask pattern 109a', and partially the flattened base electrode film 116a on both sides of the hard mask pattern 109a'. The mask pattern 118' may be arranged entirely covering the tops of the emitter electrode 114b and the hard mask pattern 109a', and edges of the flattened base electrode film 116a adjacent to the hard mask pattern 109a'. A sidewall of the mask pattern 118' may be disposed on the field isolation film 102.

Referring to FIG. 14, using the mask pattern 118' for an etching mask, the flattened base electrode film 116a and the base layer 104 may be sequentially patterned to form the base pattern 104a' and the base electrode 117'. The base pattern 104a' and the base electrode 117' may be placed on both sides of the hard mask pattern 109a'. The detailed description about the base electrode 117' has been aforementioned with reference to FIG. 4. The mask pattern 118' may be removed to expose the tops of the emitter electrode 114b and the base electrode 117'. A sidewall of the base electrode 117', which does not contact the hard mask pattern 109a', may also be exposed. A sidewall of the base pattern 104a' may be further exposed thereby.

Silicidation may be carried out on the semiconductor substrate 100, forming the first, second, and third metal silicide films 120, 121', and 122'. The first metal silicide film 120 may be formed on the exposed top of the emitter electrode 114b, while the second metal silicide film 121' is formed on the exposed top and sidewall of the base electrode 117'. The third metal silicide film 122' may be formed on the exposed sidewall of the base pattern 104a'. The process of silicidation may proceed through depositing a metal film on the semiconductor substrate 100 and conducting thermal treatment on the semiconductor substrate 100 to make the metal film react with the exposed emitter electrode 114b, base electrode 117', and base pattern 104a', resulting in the first, second, and third metal silicide films 120, 121', and 122' thereon. Subsequently, under-reacted metal films may be removed therefrom. The steps of depositing the metal film and conducting the thermal treatment may be carried out in-situ.

The interlevel insulation film 124 may be formed on the semiconductor substrate 100. The interlevel insulation film 124 may be patterned to form the emitter contact hole 126 exposing the base electrode 117', and the base contact hole 127' exposing the base electrode 117'. The base contact hole 127' may be formed in first and second base contact holes. The first base contact hole 127' may expose a first part of the base electrode 117' on one side of the hard mask pattern 109a', while the second base contact hole 127' may expose a second part of the base electrode 117' on the other side of the hard mask pattern 109a'. The emitter and base plugs 128 and 129' may be formed to fill the emitter and base contact holes 126 and 127', and the emitter and base electrodes 130 and 131' may be formed on the interlevel insulation film 124 as also shown in FIG. 4

According to the aforementioned description of example embodiments, the hard mask pattern may be formed on the base pattern that is composed of the stacked buffering insulation pattern and flatness stopping pattern. The emitter electrode may be settled in the hole that penetrates the hard mask pattern. Between the emitter electrode and the base electrode may be partially interposed or inserted the hard mask pattern. The emitter electrode may be sufficiently isolated from the base electrode. Parasitic capacitance between the emitter and base electrodes may be reduced, minimizing or reducing characteristic deterioration of the bipolar transistor. As heights of the emitter and base electrodes are determined by one step of planarization, the tops of the emitter and base electrodes may be formed on the same level. Problems (e.g., plasma etching damage on the emitter electrode and/or a relative increase of emitter resistance) arising when the emitter electrode is leveled higher than the base electrode may be prevented or reduced.

As the hole is formed by using the buffering insulation film as an etch-stopping layer, plasma etching damage on the base pattern exposed by the hole may be minimized or reduced. Because the buffering insulation film used for the etch-stopping layer is removed by means of wet etching, plasma etching damage on the base pattern exposed by the hole may be prevented or reduced. Enhance an interface characteristic between the emitter electrode and the base pattern may be possible.

The above-disclosed subject matter is to be considered illustrative, and not restrictive, and the appended claims are intended to cover all such modifications, enhancements, and other embodiments, which fall within the true spirit and scope of example embodiments. To the maximum extent allowed by law, the scope of example embodiments is to be determined by the broadest permissible interpretation of the following claims and their equivalents, and shall not be restricted or limited by the foregoing detailed description.

What is claimed is:

1. A semiconductor device comprising:
   a collector region in a semiconductor substrate;
   a base pattern on the collector region;
   a hard mask pattern including a buffering insulation pattern and a flatness stopping pattern that are stacked in sequence on the base pattern;
   an emitter electrode in a hole that penetrates the hard mask pattern and locally exposes the base pattern, being connected with the exposed base pattern; and
   a base electrode on the base pattern, contacting at least a sidewall of the hard mask pattern and level with the top of the hard mask pattern,
   wherein the flatness stopping pattern includes an insulative material with etching selectivity to the buffering insulation pattern, the emitter electrode, and the base electrode.

2. The semiconductor device as set forth in claim 1, wherein the emitter electrode is leveled with the base electrode.

3. The semiconductor device as set forth in claim 2, which further comprises:
   a first metal silicide film on the emitter electrode; and
   a second metal silicide film on the base electrode,
   wherein the emitter and base electrodes are leveled lower than the flatness stopping pattern.

4. The semiconductor device as set forth in claim 1, wherein the collector region is doped with impurities of first conductivity, the base pattern is formed of a semiconductor doped with impurities of second conductivity, and the emitter electrode is doped with impurities of the first conductivity.

5. The semiconductor device as set forth in claim 4, wherein the semiconductor substrate is a silicon substrate, the base pattern is made of silicon-germanium, and the emitter electrode is made of silicon.

6. The semiconductor device as set forth in claim 5, wherein the base electrode is formed of silicon doped with impurities of the second conductivity.

7. The semiconductor device as set forth in claim 1, wherein an inner sidewall of the hole includes an upper inner sidewall formed of the flatness stopping pattern, and a lower inner wall formed of the buffering insulation pattern,
   which further comprises:
   a spacer between the upper inner sidewall and the emitter electrode,
   wherein the lower inner sidewall extends laterally between the spacer and the base pattern.

8. The semiconductor device as set forth in claim 1, wherein the hard mask pattern includes a first sidewall contacting the base electrode, and a second sidewall not contacting the base electrode;
   wherein the base electrode includes a first electrode sidewall contacting the first sidewall of the hard mask pattern; and a second electrode sidewall opposite to the first electrode sidewall; and
   wherein the base pattern includes a first pattern sidewall aligned to the second sidewall of the hard mask pattern, and a second pattern sidewall aligned to the second electrode sidewall.

9. The semiconductor device as set forth in claim 1, wherein the base electrode contacts both sidewalls of the hard mask pattern,
   wherein the base electrode includes:
   a first electrode sidewall contacting a sidewall of the hard mask pattern; and
   a second electrode sidewall opposite to the first electrode sidewall,
   wherein a sidewall of the base pattern is aligned to the second electrode sidewall.

10. The semiconductor device as set forth in claim 1, which further comprises:
    a field isolation film in the semiconductor substrate, defining the collector region;
    an interlevel insulation film on the semiconductor substrate including the hard mask pattern, the emitter electrode, and the base electrode;
    emitter and base plugs penetrating the interlevel insulation film, being conductively connected to the emitter and base electrodes, respectively; and
    emitter and base interconnections on the interlevel insulation film, being conductively connected to the emitter and base plugs, respectively.

* * * * *